US009324942B1

(12) United States Patent
Nazarian et al.

(10) Patent No.: US 9,324,942 B1
(45) Date of Patent: Apr. 26, 2016

(54) RESISTIVE MEMORY CELL WITH SOLID STATE DIODE

(71) Applicant: Crossbar, Inc., Santa Clara, CA (US)

(72) Inventors: Hagop Nazarian, San Jose, CA (US); Tanmay Kumar, Pleasanton, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 51 days.

(21) Appl. No.: 13/756,498

(22) Filed: Jan. 31, 2013

(51) Int. Cl.
*H01L 45/00* (2006.01)

(52) U.S. Cl.
CPC .............. *H01L 45/08* (2013.01); *H01L 45/16* (2013.01)

(58) Field of Classification Search
CPC . H01L 45/1233; H01L 45/085; H01L 45/148; H01L 27/2481; H01L 27/1021; H01L 27/2409; H01L 45/06; H01L 45/145; H01L 45/1253; H01L 45/1608
See application file for complete search history.

(56) References Cited

U.S. PATENT DOCUMENTS

| | | | |
|---|---|---|---|
| 4,433,468 A | 2/1984 | Kawamata | |
| 4,684,972 A | 8/1987 | Owen et al. | |
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,465,186 A * | 11/1995 | Bajorek et al. | 360/323 |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Office Action for U.S. Appl. No. 13/434,567, dated Feb. 6, 2014.

(Continued)

*Primary Examiner* — Whitney T Moore
(74) *Attorney, Agent, or Firm* — Amin, Turocy & Watson, LLP

(57) ABSTRACT

Providing for a solid state memory cell having a resistive switching memory cell with rectifier characteristics is described herein. By way of example, the solid state memory cell can have one or more layers creating a resistive switching device capable of achieving and maintaining different electrical resistances in response to different voltages applied to the solid state memory cell. Moreover, the solid state memory cell can comprise two or more layers creating a solid state diode device electrically in series with the resistive switching device. The solid state diode device can be configured to permit very low current through the solid state memory cell at voltages less than a breakdown voltage or reverse breakdown voltage. The rectifier characteristics can mitigate sneak path currents in a crossbar memory array, or similar array, facilitating greater sensing margin, reduced likelihood of memory errors, greater die concentration, fast switching times, and other benefits.

20 Claims, 12 Drawing Sheets

(56) References Cited

U.S. PATENT DOCUMENTS

| | | |
|---|---|---|
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,969,561 A * | 10/1999 | McGillan ............... 327/308 |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,806,526 B2 | 10/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Nazarian et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0131501 A1 * | 6/2006 | Ikushima et al. .......... 250/338.1 |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |

(56) References Cited

U.S. PATENT DOCUMENTS

| | | |
|---|---|---|
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2014/0070160 A1* | 3/2014 | Ishikawa et al. ............... 257/4 |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 10-2011-00142448 A | 2/2011 |
| WO | WO 03/034498 A1 | 4/2003 |
| WO | WO 2009/005699 A1 | 1/2009 |

OTHER PUBLICATIONS

Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 13/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Jian Hu et al., "Area-Dependent Switching in Thin Film-Silicon Devices", Materials Research Society Proceedings, 2003, pp. AI8.3.1-AI8.3.6, vol. 762, No. 1, Cambridge University Press.
Andre Dehon, "Array-Based Architecture for FET-Based, Nanoscale Electronics", IEEE Transactions on Nanotechnology, Mar. 2003, pp. 23-32, vol. 2, No. 1.
Herb Goronkin et al., "High-Performance Emerging Solid-State Memory Technologies", MRS Bulletin, Nov. 2004, pp. 805-813, www.mrs.org/publications/bulletin.
Gerhard Muller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North-Holland Publishing Company.
J. Campbell Scott, "Is There an Immortal Memory?", www.sciencemag.org, Apr. 2, 2004, pp. 62-63, vol. 304, No. 5667.
S.H. Lee et al., "Full Integration and Cell Characteristics for 64Mb Nonvolatile PRAM", 2004 Symposium on VLSI Technology Digest of Technical Papers, pp. 20-21, 2004, IEEE.
Stephen Y. Chou et al., "Imprint Lithography With 25-Nanometer Resolution", Science, Apr. 5, 1996, pp. 85-87, vol. 272.
S. Zankovych et al., "Nanoimprint Lithography: Challenges and Prospects", Institute of Physics Publishing, Nanotechnology 12, 2001, pp. 91-95.
A. Avila et al., "Switching in Coplanar Amorphous Hydrogenated Silicon Devices", Solid-State Electronics 44, 2000, pp. 17-27.
Jian Hu et al., "Switching and Filament Formation in Hot-Wire CVD P-Type A-Si:H Devices", Science Direct, Thin Solid Films 430, 2003, pp. 249-252, www.sciencedirect.com.
S. Hudgens et al,. "Overview of Phase-Change Chalcogenide Nonvolatile Memory Technology", MRS Bulletin, Nov. 2004, pp. 829-832, www.mrs.org/publications/bulletin.
K. Terabe et al., "Quantized Conductance Atomic Switch", Nature, vol. 433, Jan. 6, 2005, pp. 47-50, www.nature.com/ nature.
Michael Kund et al., "Conductive Bridging RAM (CBRAM): An Emerging Non-Volatile Memory Technology Scalable to Sub 20nm", IEEE, 2005.
W. Den Boer, "Threshold Switching in Hydrogenated Amorphous Silicon", American Institute of Physics, 1982, pp. 812-813.

(56) References Cited

OTHER PUBLICATIONS

P.G. Lecomber et al., "The Switching Mechnism in Amorphous Silicon Junctions", Journal of Non-Crystalline Solids 77 & 78, 1985, pp. 1373-1382, North-Holland, Amsterdam.
A. E. Owen et al., "Switching in Amorphous Devices", Int. J. Electronics, 1992, pp. 897-906, vol. 73, No. 5.
M. Jafar et al., "Switching in Amorphous-Silicon Devices", The American Physical Society, 1994, pp. 611-615, vol. 49, No. 19.
Stikeman, Alexandra, "Polymer Memory—The Plastic Path to Beller Data Storage," Technology Review, Sep. 2002, p. 31, www.technology review.com.
Yong Chen et al. "Nanoscale molecular-switch crossbar circuits," Nanotechnology 14, 2003, pp. 462-468, vol. 1.14, Institute of Physics Publishing.
C.P. Collier et al. "Electronically Configurable Molecular-Based Logic Gates," Science, Jul. 16, 1999, pp. 391-395, vol. 285, No. 5426.
Office Action for U.S. Appl. No. 11/875,541, dated Jul. 22, 2010.
Office Action for U.S. Appl. No. 11/875,541, dated Mar. 30, 2011.
Office Action for U.S. Appl. No. 11/875,541, dated Oct. 5, 2011.
Office Action for U.S. Appl. No. 11/875,541, dated Jun. 8, 2012.
Choi, Jang Wook, "Molecular Electronic Crossbar Memory Circuits", Bistable [2]Rotaxane Based Molecular Electronics: Fundamentals and Applications, Chapter 3, pp. 79-124, Dissertation, California Institute of Technology.
Sung-Hyun Jo et al., "A Silicon-Based Crossbar Ultra-High-Density Non-Volatile Memory", SSEL Annual Report 2007.
International Search Report for PCT/US2009/060023, filed on Oct. 8, 2009.
Waser, R et al., "Nanoionics-based Resistive Switching Memories", Nature Materials, Nov. 2007, pp. 833-835, vol. 6.
Written Opinion of the International Searching Authority for PCT/US2009/060023, filed on Oct. 8, 2009.
Ex Parte Quayle Action for U.S. Appl. No. 12/826,653, dated May 8, 2012.
International Search Report for PCT/US2011/040090, filed on Jun. 10, 2011.
Written Opinion of the International Searching Authority for PCT/US2011/040090, filed on Jun. 10, 2011.
Notice of Allowability for U.S. Appl. No. 13/158,231, dated Apr. 17, 2012.
Office Action for U.S. Appl. No. 12/835,704, dated Sep. 21, 2011.
Office Action for U.S. Appl. No. 12/835,704, dated Mar. 1, 2012.
Advisory Action for U.S. Appl. No. 12/835,704, dated Jun. 8, 2012.
International Search Report and Written Opinion for PCT/US2011/046035, filed on Jul. 29, 2011.
Office Action for U.S. Appl. No. 12/861,650, dated Jan. 25, 2012.
Notice of Allowability for U.S. Appl. No. 12/861,650, dated Jun. 19, 2012.
Sung Hyun Jo et al., "Programmable Resistance Switching in Nanoscale Two-Terminal Devices," Supporting Information, Dec. 29, 2008, pp. 1-4, vol. 9. No. 1, Department of Electrical Engineering and Computer Science, The University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., Si-Based Two-Terminal Resistive Switching Nonvolatile Memory, 2008, IEEE.
Sung Hyun Jo et al., "Nanoscale Memristor Device as Synapse in Neuromorphic Systems", Nano Letters, 2010, pp. 1297-1301, pubs. acs.org/NanoLett, A-E, American Chemical Society Publications.
Wei Lu et al., "Nanoelectronics from the bottom up," Nature Materials—Review Articles | Insight, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices," 2006.
Sung Hyun Jo et al., "Experimental, Modeling and Simulation Studies of Nanoscale Resistance Switching Devices," 2009, IEEE.
Sung Hyun Jo et al., "Nonvolatile Resistive Switching Devices Based on Nanoscale Metal/Amorphous Silicon/Crystalline Silicon Junctions," Mater. Res. Soc. Symp. Proc., 2007, vol. 997, Materials Research Society.
Sung Hyun Jo et al., "Si Memristive Devices Applied to Memory and Neuromorphic Circuits."
Wei Lu et al., "Supporting Information," 2008.
Sung Hyun Jo et al., "High-Density Crossbar Arrays Based on a Si Memristive System," Nano Letters, 2009, pp. 870-874, vol. 9, No. 2, American Chemical Society Publications.
Sung Hyun Jo et al., "High-Density Crossbar Arrays Based on a Si Memristive System," Supporting Information, 2009, pp. 1-4.
Sung Hyun Jo et al., "Programmable Resistance Switching in Nanoscale Two-Terminal Devices," Nano Letters, 2009, pp. 496-500, vol. 9, No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24, No. 10, Jpn. J. Appl. Phys.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids 115, 1989, pp. 168-170, Elsevier Science Publishers B.V., North-Holland.
A. Moopenn et al., "Programmable Synaptic Devices for Electronic Neural Nets", Control and Computers, 1990, pp. 37-40, vol. 18, No. 2.
P.G. Le Comber, "Present and Future Applications of Amorphous Silicon and Its Alloys", Journal of Non-Crystalline Solids 115, 1989, pp. 1-13, Elsevier Science Publishers B.V., North-Holland.
Hu, J., et. al. "AC Characteristics of Cr/p/sup +/ A-Si:HIV Analog Switching Devices." IEEE Transactions on Electron Devices, Sep. 2000, pp. 1751-1757, vol. 47, No. 9.
Owen, A.E. et al., "New amorphous-silicon electrically programmable nonvolatile switching device," Solid-State and Electron Devices, IEEE Proceedings I, Apr. 1982, pp. 51-54, vol. 129, No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures," Philosophical Magazine B, 1991, pp. 349-369, vol. 63, No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Dong, Y., et al., "Si/a-Si Core/Shell Nanowires as Nonvolatile Crossbar Switches", Nano Letters, Jan. 2008, pp. 386-391, vol. 8, No. 2.
European Search Report for Application No. EP 09 81 9890.6 of Mar. 27, 2012.
D. A. Muller, et al., "The Electronic Structure At the Atomic Scale of Ultrathin Gate Oxides", Nature, Jun. 1998, pp. 758-761, vol. 399, No. 24.
Sune, J. et al., "Nondestructive Multiple Breakdown Events in Very Thin SiO2 Films." Applied Physics Letters, 1989, vol. 55 No. 128.
Herve Marand, "Materials Engineering Science", MESc 5025, Chapter 7, University of Vermont, http://www.files.chem.vt.edu/chemdeptimarand/MEScchap6-1 c.pdf.
Owen, A.E. et al., "Electronic switching in amorphouse silicon devices: properties of the conducting filament", Proceedings of the 5th International Conference on Solid-State and Integrated Circuit Technology, 1998, pp. 830-833.
Jo, Sung Hyun, "Nanoscale Memristive Devices for Memory and Logic Applications", Thesis, University of Michigan, 2010.
Office Action for U.S. Appl. No. 12/894,098, dated Aug. 1, 2012.
Sung Hyun Jo et al., "CMOS Compatible Nanoscale Nonvolatile Resistance Switching Memory," Nano Letters, 2008, pp. 392-397, vol. 8, No. 2, American Chemical Society Publications.
Office Action for U.S. Appl. No. 12/582,086, dated Apr. 19, 2011.
Office Action for U.S. Appl. No. 12/582,086, dated Sep. 6, 2011.

(56) References Cited

OTHER PUBLICATIONS

Notice of Allowance for U.S. Appl. No. 12/582,086, dated Oct. 21, 2011.
International Search Report for PCT/US2009/061249, filed on Oct. 20, 2009.
Written Opinion of the International Searching Authority for PCT/US2009/061249, filed on Oct. 20, 2009.
Office Action for U.S. Appl. No. 12/861,650, dated Oct. 16, 2012.
Notice of Allowance for U.S. Appl. No. 12/894,087, dated Oct. 25, 2012.
Notice of Allowance for U.S. Appl. No. 13/149,807, dated Oct. 29, 2012.
Notice of Allowance for U.S. Appl. No. 12/861,666, dated Nov. 14, 2012.
Office Action for U.S. Appl. No. 13/156,232, dated Nov. 26, 2012.
Notice of Allowance for U.S. Appl. No. 13/290,024, dated Nov. 28, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 12/835,699, dated Aug. 24, 2011.
Notice of Allowance for U.S. Appl. No. 12/835,699, dated Feb. 6, 2012.
Office Action for U.S. Appl. No. 12/833,898, dated Apr. 5, 2012.
European Search Report for Application No. EP 1100 5207.3 of Oct. 12, 2011.
Notice of Allowance for U.S. Appl. No. 12/833,898, dated May 30, 2012.
Notice of Allowance for U.S. Appl. No. 12/939,824, dated May 11, 2012.
Notice of Allowance for U.S. Appl. No. 12/940,920, dated Oct. 5, 2011.
Office Action for U.S. Appl. No. 13/314,513, dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653, dated Apr. 25, 2012.
International Search Report for PCT/US2011/045124, filed on Jul. 22, 2011.
Written Opinion of the international Searching Authority for PCT/US2011/045124, filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute pf Physics.
J. Del Alamo et al., "Operating limits of Al-alloyed high-low junction for BSF solar cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 mailed Aug. 8, 2012.
Office Action for U.S. Appl. No. 13/417,135, dated Oct. 9, 2012.
Notice of Allowance for U.S. Appl. No. 13/532,019, dated Nov. 14, 2012.
Office Action for U.S. Appl. No. 13/149,653, dated Nov. 20, 2012.
Office Action of U.S. Appl. No. 13/436,714, dated Dec. 7, 2012.

* cited by examiner

RESISTIVE MEMORY CELL WITH SOLID STATE DIODE

TECHNICAL FIELD

The subject disclosure provides generally for a two-terminal solid state memory cell, and more particularly for a two-terminal solid state resistive memory cell having a solid state diode device.

BACKGROUND

A recent innovation within the field of integrated circuit technology is resistive random access memory (RRAM). While much of RRAM technology is in the development stage, various technological concepts for RRAM have been demonstrated and are in one or more stages of verification to prove or disprove associated theory(ies). Even so, RRAM technology promises to hold substantial advantages over competing technologies in the semiconductor electronics industry.

RRAM technology—particularly for memory cells—is based on the technical principle of resistive switching. Resistive switching behavior has been observed for some time. Some non-volatile, two-terminal memory structures have been proposed. For example, ferroelectric random access memory (RAM) is one such alternative. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, . . . ) are projected in association with producing these devices. In addition, these devices can exhibit relatively slow switching speeds, small on/off resistance ratios (e.g., leading to small sensing margin) or poor thermal stability, as well as other problems.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In particular aspects of the subject disclosure, provided is a solid state memory cell. The solid state memory cell can comprise an ion source layer comprising unbound conductive ions and an insulator layer that is at least in part permeable to the unbound conductive ions of the ion source layer. Moreover, the solid state memory cell can comprise a p semiconductor layer. In addition, the solid state memory cell can comprise an n semiconductor layer adjacent to the p semiconductor layer, wherein the p semiconductor layer and the n semiconductor layer are exclusive to the memory cell and form a solid-state p-n diode.

In still other disclosed aspects, provided is a method of fabricating a solid state memory cell. The method can comprise forming a conductive stratum comprising at least partially unbound conductive ions. Furthermore, the method can comprise forming an insulation stratum adjacent to the conductive stratum that is permeable to the unbound conductive ions. In addition to the foregoing, the method can comprise forming two or more strata, dedicated to the memory cell, a first of the two or more strata is adjacent to the insulation stratum, and the two or more strata in combination create a solid state diode.

According to one or more other aspects of the subject disclosure, provided is an electronic memory device comprising an array of discrete memory cells arranged in a crossbar architecture. The discrete memory cells can comprise a first layer comprising free ions and a second layer comprising an electrical insulator that is at least in part permeable to the free ions of the first layer. In addition, the discrete memory cells can comprise a p+ semiconductor layer and an n− semiconductor layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
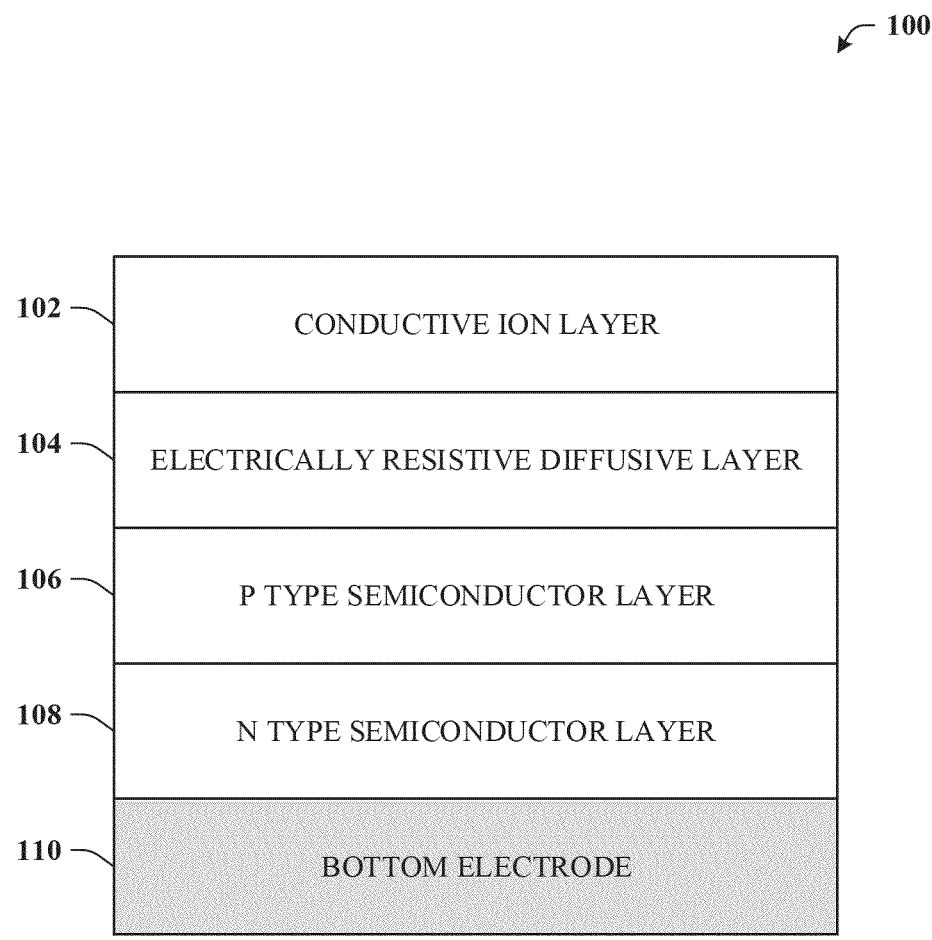
FIG. 1 depicts a block diagram of a sample two-terminal memory cell comprising rectifier characteristics according to aspects of the subject disclosure.

This disclosure relates to two-terminal memory cells, particularly resistive switching two-terminal memory cells, in various embodiments. Resistive switching two-terminal memory cells (also referred to as resistive switching memory cells), as utilized herein, comprise circuit components having two electrical contacts (also referred to herein as electrodes or terminals) with an active region between the two conductive contacts. The active region of the two-terminal memory device exhibits a plurality of stable or semi-stable resistive states, each resistive state having different electrical resistance. Moreover, respective ones of the plurality of states can be formed or activated in response to a respective voltage difference applied at the two conductive contacts. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon bearing layer (e.g., p-type or n-type polysilicon, p-type or n-type SiGe, . . . ), a resistive switching layer (RSL) and an active metal layer for providing filament forming ions to the RSL. The p-type or n-type silicon bearing layer can include a p-type or n-type polysilicon, p-type or n-type SiGe, or the like. The RSL (which can also be referred to in the art as a resistive switching media (RSM)) can comprise, e.g., an undoped amorphous silicon layer, a semiconductor layer having intrinsic characteristics, a silicon sub-oxide, and so forth. Examples of the active metal layer can include, among others: silver (Ag), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that a variety of RSL memory cell technologies exist, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage. Where an embodiment does not specify a unipolar or bipolar characteristic, or does not indicate suitable program/erase voltages, it is intended that such aspects and embodiments incorporate any suitable memory cell technology and be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

With pertinence to various aspects of the subject disclosure, the inventors have found that resistive switching memory cell technology can generally be small for an electronic memory cell, typically consuming silicon area on the order of $4F^2$ per adjacent resistive switching device, where F is the minimum feature size of a specific technology node (e.g., a memory cell comprising two resistive switching devices would therefore be approximately $8F^2$ if constructed in adjacent silicon space). Non-adjacent embodiments of the present disclosure, e.g., stacked above or below each other, can consume as little as $4F^2$ for a set of multiple non-adjacent devices. Such can lead to greater semiconductor component density and memory density, and low manufacturing costs for a given number of transistors relative to competing technologies. Embodiments of the present disclosure can also exhibit very fast programming and/or switching speed along with a relatively low programming current. Additional embodiments can provide non-volatile memory, having the capacity to store data without continuous application of power. In addition to the foregoing, some embodiments can generally be built between metal interconnect layers, enabling further embodiments that can be included within two-dimensional as well as three-dimensional semiconductor architectures.

To program one or more disclosed embodiments, a suitable program voltage can be applied across the memory cell causing a conductive filament to form through a resistive, portion of the memory cell. This causes the memory cell to switch from a relatively high resistive state, to a relatively low resistive state. An erase process can be implemented to reverse the process, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing binary information. For various reasons, resistive switching memory cells are generally quick to program and responsive, changing state readily in response to a program voltage. This quick switching of state is a significant advantage of various disclosed memory cells over other memory cell technologies.

One example of a conductive filament device is a three-layer memory cell arrangement of metal/amorphous silicon (a-Si)/metal. This three-layer memory cell is an example of an a-Si resistive switching device. The a-Si layer essentially serves as a digital information storage medium. A resistive switching behavior is often characterized in terms of conductive filament formation inside an otherwise non-conductive a-Si material. This filament formation results from applying a positive voltage at metal layers on opposite sides of the a-Si material. Though resistive switching devices based on the resistive switching principle have great technological promise, the inventors of the subject disclosure believe they can have some drawbacks as well. For instance, some metal/a-Si/metal devices form micron-sized filament structures, which can make sub-100 nanometer scale devices more difficult to achieve. Also, many metal/a-Si/metal structures require high current for filament formation. For instance, current as high as one hundred microamps or more are not un-common with such devices, greatly increasing power consumption for fundamental switching behavior. This has a negative impact on scaling; high current density can obviate close placement of conductive lines (e.g., twenty nm lines). In addition, filament formation can be difficult to control, and formation of a permanent conductive filament within the a-Si layer can destroy the switching capability of the device (e.g., essentially rendering the a-Si layer permanently conductive, and therefore incapable of switching from a low resistance state to a high resistance state).

Viewed broadly, embodiments of the present disclosure have the potential to replace other types of memory existing in the marketplace due to the numerous advantages over competing technologies. However, the inventors of the subject disclosure believe that what is sometimes referred to as the sneak path problem is an obstacle for resistive switching memory cells. A sneak path (also referred to as "leak path") can be characterized by undesired current flowing through neighboring memory cells, which can be particularly evident in large passive memory crossbar arrays, particularly in connection with cells in an "on" state (relatively low resistance state).

In more detail, sneak path current can result from a voltage difference across adjacent or nearby bitlines of a memory array. For instance, a memory cell positioned between metal inter-connects (e.g., bitlines and wordlines) of a crossbar array may not be a true electrical insulator, and thus a small amount of current can flow in response to the aforementioned voltage differences. Further, these small amounts of current can add together, particularly when caused by multiple voltage differences observed across multiple metal inter-connects. During a memory operation, sneak path current(s) can co-exist with an operating signal (e.g., program signal, erase signal, read signal, etc.) and reduce operational margin, for example, the current and/or voltage margin between reading a programmed cell (associated with a first physical state) and an erased cell (associated with a second physical state). For instance, in conjunction with a read operation on a selected memory cell, sneak path current sharing a read path with the selected memory cell can add to a sensing current, reducing sensing margin of read circuitry. In addition to increased power consumption and joule heating, and the detriments related thereto, sneak path currents can lead to memory cell errors—a problem that can undermine reliability in the memory itself.

One way to mitigate the problem of sneak path current is to employ a 1T-1R memory array architecture. The 1T-1R architecture includes a transistor switch with each resistive switching device. The transistor switch can be utilized to deactivate the resistive switching memory device (e.g., isolate from one or more neighboring memory devices) when not selected for a memory operation. The transistor in effect can be turned "off", greatly reducing current flow in series with the resistive switching device, even when the resistive switching device itself is programmed, or in an "on" state (facilitating much higher current flow through the resistive switching element itself). However, the 1T-1R model has a cost in power consumption and die size (or memory cells per unit area). An improvement upon the 1T-1R architecture is a 1 T-xR architecture, where x is an integer greater than 1. To accomplish this, a memory cell is combined with some other sneak-path mitigation technique so that multiple resistive switching memory cells can be activated or deactivated by a single transistor (e.g., a select transistor). The subject disclosure provides for a memory cell having a non-linear current-voltage relationship, having a positive threshold voltage that causes a non-linear change from a high resistance state to a low resistance state (see, e.g., co-pending U.S. patent application Ser. No. 13/149,757 filed May 31, 2011, which is incorporated by reference herein in its entirety and for all purposes).

In various aspects of the subject disclosure, a solid state memory cell is provided having diode rectifier characteristics. The solid state memory cell can comprise a discrete stack of contiguous materials forming a resistive switching device electrically in series with a rectifier device (e.g., a diode). In a particular aspect(s), the rectifier device can comprise a p-n diode device. In at least one aspect, the rectifier device can comprise a p-n diode device, with suitable dopant (impurity) doping to provide the rectifier characteristics. In at least one other aspect, the rectifier device can comprise a schottky-type diode device, having a p semiconductor layer contiguous with a metal layer or electrode. The solid state memory cells disclosed herein can greatly mitigate sneak path currents, so long as sneak-path related voltages do not exceed a rectification voltage of the rectifier device. Solid state memory cells with such rectifier characteristics can facilitate a 1T-xR memory cell architecture with relatively large 'x' values.

Referring now to the drawings, FIG. 1 illustrates a block diagram of an example memory cell 100 having resistive switching and rectifier characteristics, according to one or more aspects of the subject disclosure. Memory cell 100 can comprise a stack of contiguous layers. The contiguous layers can comprise different materials, and some of the materials (e.g., semiconductor materials) can comprise conductive ions (e.g., electrons, holes, . . . ).

Memory cell 100 can comprise a conductive ion layer 102, at one end of the stack of contiguous layers. Conductive ion layer 102 can comprise a metal, for instance. In some aspects, conductive ion layer 102 can comprise a metal electrode (e.g., a wire, a nanowire, . . . ). In at least one such aspect, conductive ion layer 102 can comprise a silver (Ag) electrode, though in other aspects conducive ion layer 102 can comprise another suitable conductive material (e.g., gold (Au), titanium (Ti), nickel (Ni), aluminum (Al), chromium (Cr), iron (Fe), manganese (Mn), tungsten (W), vanadium (V), cobalt (Co), platinum (Pt), palladium (Pd), or the like, or a suitable compound/combination thereof. In other aspects, conductive ion layer 102 can comprise a discrete conductive material deposited, etched, etc., onto a bitline, wordline, dataline, or other suitable electrode.

Adjacent to conductive ion layer 102 is an electrically resistive diffusive layer 104. Electrically resistive diffusive layer 104 can be selected to be at least in part permeable to free ions (e.g., silver ions, . . . ) of conductive ion layer 102. Electrically resistive diffusive layer 104 can comprise an insulating material having relatively high electrical resistance compared with conductive ion layer 102. Due to the permeability to free ions of conductive ion layer 102, electrically resistive diffusive layer 104 can facilitate formation of a conductive filament of ions through electrically resistive diffusive layer 104, in response to a suitable positive voltage (e.g., a program voltage) applied to memory cell 100. This conductive filament of ions can facilitate a much lower electrical resistance, at least through a portion of electrically resistive diffusive layer 104 comprising the conductive filament (e.g., see FIG. 2) than the above relatively high electrical resistance of the insulating material. Moreover, retraction or partial retraction of the conductive filament of ions can occur in response to a suitable negative voltage applied to memory cell 100, restoring electrically resistive diffusive layer 104 to relatively high electrical resistance. When established, this conductive filament of ions can be stable over time, maintaining the much lower electrical resistance at zero or positive voltages (or small negative voltages larger than the suitable negative voltage). Refraction or partial retraction of the conductive filament can be stable over time as well, maintaining the relatively high electrical resistance at voltages below the suitable positive voltage. In at least one aspect of the subject disclosure, the insulating material can be an a-Si or derivative of silicon oxide material. Other suitable insulating materials can be employed in other aspects, which can include a resistive switching material layer (RSML), a non-conductive silicon containing layer, or the like, or a suitable combination of the foregoing.

In at least one aspect of the subject disclosure, electrically resistive diffusive layer 104 can be formed of an upper region of a p-type polycrystalline silicon or p-type silicon germanium bearing layer using a chemical vapor deposition (CVD), physical vapor deposition (PVD), oxygen plasma ashing, Ar amorphization of the upper region of the p-type silicon bearing layer, or the like. For instance, a plasma etch may use a bias power within a range of approximately 30 watts to approximately 120 watts to convert an upper region of the polysilicon or silicon germanium material into a non-conductive RSL having p-type impurities or a native silicon oxide (from the original polycrystalline silicon or silicon germanium bearing layer). In some further aspects, electrically resistive diffusive layer 104 includes a $SiO_x$, including a sub-oxide in which x<2. In at least one aspect, electrically resistive diffusive layer 104 can comprise a silicon germanium oxide compound. This latter compound can comprise, for instance, four units of germanium or two units of oxygen (e.g., $Si_xGe_4O_2$) In particular aspects, electrically resistive diffusive layer 104 can be on the order of about 1 nanometer (nm) to about 50 nm (e.g., 10 nm), and in some embodiments, layer 104 may be on the order of about 1 to about 5 nm.

Figure 12:
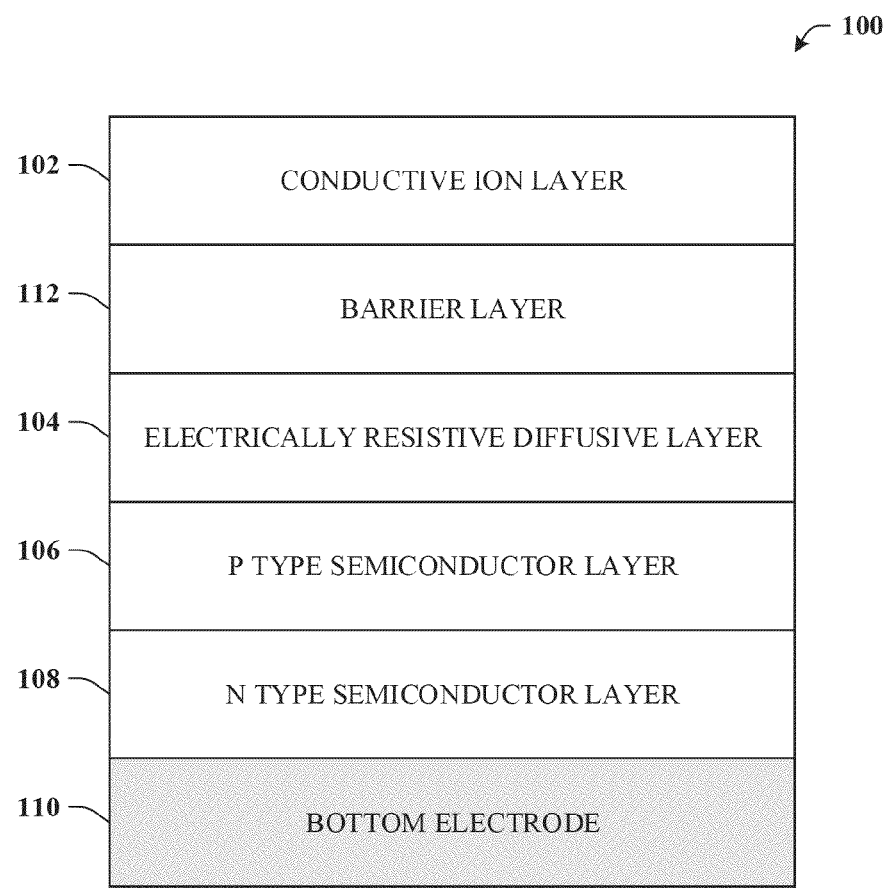
FIG. 12 depicts a block diagram of a sample two-terminal memory cell comprising rectifier characteristics and a barrier layer according to aspects of the subject disclosure.

In alternative or additional aspects of the subject disclosure as depicted in FIG. 12, memory cell 100 can comprise a barrier layer 112 between conductive ion layer 102 and electrically resistive diffusive layer 104. The barrier layer can be configured to shield electrically resistive diffusive layer 104 from contaminants, oxygen, or the like. In a particular aspect, the barrier layer can be formed from titanium, a titanium oxide, a titanium nitride, or the like. (The barrier layer could be employed for memory cells 400A or 400B in some aspects as well, also between the donor ion layer and diffusive layer).

Memory cell 100 can further comprise a p type semiconductor layer 106 contiguous to electrically resistive diffusive layer 104. P type semiconductor layer 106 can be doped to have a concentration of p type material. In one aspect, the p type material dopant can be boron, or another suitable p type dopant. In additional aspects, a concentration of p type material dopant can be between about $10^{13}$ particles per cubic centimeter ($/cm^3$) and about $10^{17}/cm^3$. In at least one aspect, the concentration of p type material dopant can yield a p+ semiconductor device having between about $10^{17}/cm^3$ and about $10^{20}/cm^3$.

Memory cell 100 can additionally comprise an n type semiconductor layer 108 contiguous to p type semiconductor layer 106. N type semiconductor layer 108 can be doped to have a concentration of n type material. In one aspect, the n type material dopant can be phosphorous, or another suitable n type dopant. In additional aspects, a concentration of n type material dopant can be between about $10^{13}$ particles per cubic centimeter ($/cm^3$) and about $10^{20}/cm^3$. In some aspects, the concentration of n type material dopant can yield an n− semiconductor device having between about $10^{13}/cm^3$ and about $10^{15}/cm^3$.

Memory cell 100 can also comprise a bottom electrode 110 contiguous to n type semiconductor layer 108. Bottom electrode 110, in conjunction with a top electrode at an opposite end of memory cell 100, can facilitate applying a voltage across memory cell 100. By selecting suitable voltage characteristics (e.g., magnitude, polarity, pulse width, pulse rate, . . . ), memory operations can be performed on memory cell 100, including a read operation, an erase operation or a program operation, or the like. In some aspects of the subject disclosure, the top electrode can be conductive ion layer 102. In other aspects, the top electrode can be a conductive wire or nanowire connected to conductive ion layer 102.

As depicted, memory cell 100 can form a circuit comprising a resistive switching element electrically in series with a diode element. The resistive switching element can comprise conductive ion layer 102 and electrically resistive diffusive layer 104 (or electrically resistive diffusive layer 104 alone following establishment of the conductive filament within electrically resistive diffusive layer 104). The diode element can comprise p type semiconductor layer 106 in conjunction with n type semiconductor layer 108. The contiguous arrangement of the stack of layers 102, 104, 106 and 108 form the resistive switching element electrically in series with the diode element. The diode element has rectifier characteristics, including a breakdown voltage and a reverse breakdown voltage. The rectifier characteristics can significantly mitigate sneak path currents associated with a memory cell array comprised of multiple instances of memory cell 100, as is described in more detail herein.

Figure 2:
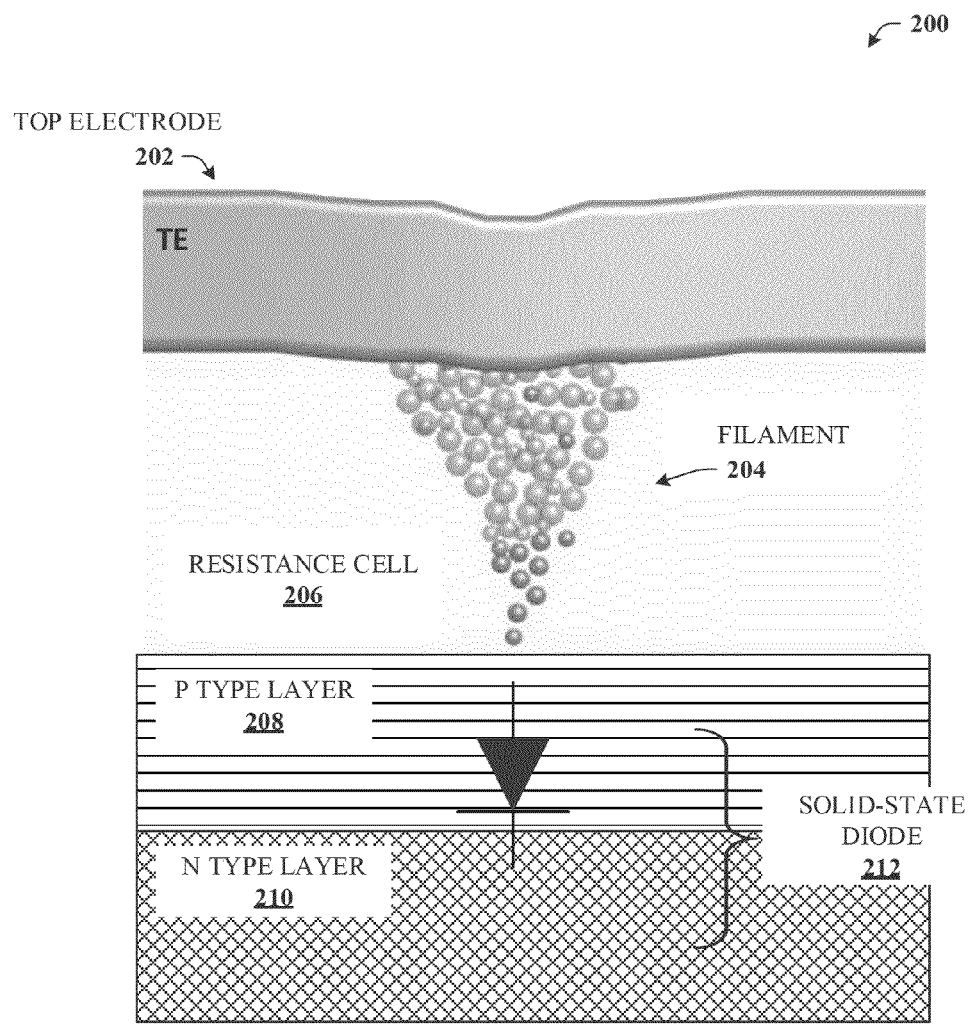
FIG. 2 illustrates a block diagram of an example two-terminal solid state memory cell and electrical characteristics thereof.

FIG. 2 depicts a diagram of an example memory cell 200 according to additional aspects of the subject disclosure. Particularly, memory cell 200 illustrates an example of a conductive filament formed within a resistive switching device. Moreover, memory cell 200 illustrates a diode device electrically in series with the resistive switching device. Memory cell 200 can be formed as a discrete memory element at a junction of a plurality of conductive electrodes in a crossbar memory array, in one example implementation of a memory array architecture comprised of multiple instances of memory cell 200.

Memory cell 200 can comprise a top electrode 202 comprising conductive ions. In response to a suitable positive voltage (e.g., a program voltage), ions of top electrode 202 can move into an adjacent layer of memory cell 200—that is at least partially permeable to the ions—to form a conductive filament 204. Conductive filament 204 facilitates electrical conductivity through a resistance cell 206. In response to a suitable negative voltage (e.g., an erase voltage), conductive filament 204 can at least in part be deformed, breaking the electrical conductivity through resistance cell 206. In this manner, resistance cell 206 can have two possible states, a relatively low conductivity state or a relatively high conductivity state.

Memory cell 200 can further comprise a p type layer 208 adjacent to an n type layer 210. In a particular aspect of the subject disclosure, p type layer 208 can have moderate p type doping, and n type layer can have very high n type doping. In one example, the moderate p type doping can comprise a dopant concentration of about $10^{13}$~$10^{17}/cm^3$, whereas the very high n type doping (e.g., yielding an n++ type layer) can comprise a dopant concentration of about $10^{16}$~$10^{20}/cm^3$. In combination, p type layer 208 and n type layer 210 form a solid-state diode 212. Solid state diode 212 can have a threshold voltage that mitigates current flow through memory cell

200 in one direction (e.g., from top electrode through resistance cell 206 and solid state diode 212) in response to a voltage across memory cell 200 less than the threshold voltage. Additionally, solid state diode 212 can have a reverse breakdown voltage that mitigates current flow in a second direction (e.g., from solid-state diode 212 through resistance cell 206 to top electrode 202) in response to a negative voltage across memory cell 200 having a magnitude less than the reverse breakdown voltage. In a memory cell architecture, the threshold voltage and reverse breakdown voltage can significantly reduce sneak path current through memory cell 200, substantially overcoming one problem the inventors have identified to be associated with solid state crossbar memory arrays.

Figure 3:
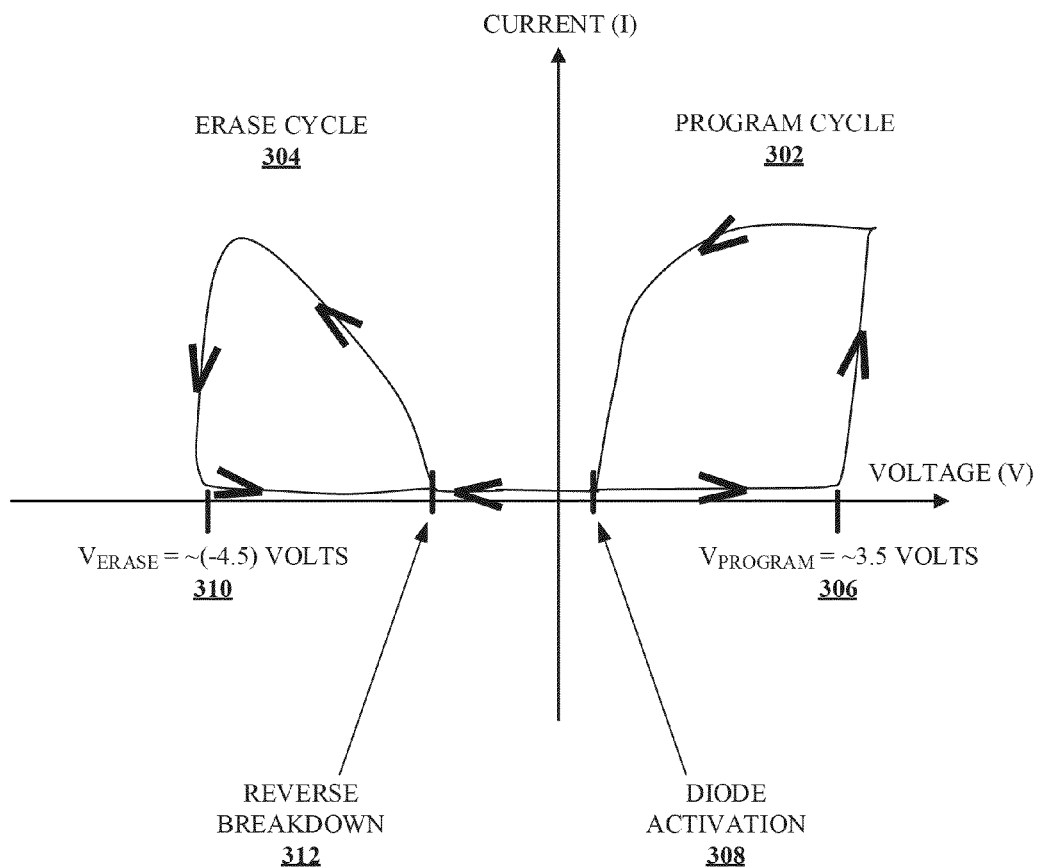
FIG. 3 depicts an example current voltage diagram that can correspond to the example two-terminal solid state memory cell of FIG. 2.

FIG. 3 illustrates an example current-voltage diagram 300 for a resistive switching memory cell having rectifier characteristics according to various aspects of the subject disclosure. In some aspects, current-voltage diagram 300 can correspond to memory cell 100 of FIG. 1, or memory cell 200 of FIG. 2, supra. However, the subject disclosure is not limited to such aspects. For instance, in other aspects, current-voltage diagram 300 or a similar example current-voltage diagram can correspond with memory cells 400A or 400B of FIG. 4, infra, or a like memory cell made known to one of skill in the art by way of the context provided herein.

Current-voltage diagram 300 illustrates a current response of a memory cell in response to an applied voltage for a program cycle 302, and for an erase cycle 304. Referring first to program cycle 302, a voltage applied across the off-state (high resistance state) memory cell yields very low current between zero volts up to a positive program voltage $V_{PROGRAM}$ 306. In one example, $V_{PROGRAM}$ 306 can have a value of approximately 3.5 volts; however the subject disclosure is not limited to this aspect and the program voltage could have other suitable values.

Once the voltage reaches a value of $V_{PROGRAM}$ 306, current increases significantly, as depicted by FIG. 3. The increase in current corresponds with creation of a conductive filament in a resistive switching memory cell (e.g., see conductive filament 204 of FIG. 2, supra). As the voltage value is backed off after reaching the $V_{PROGRAM}$ 306 value, current decreases to a very low magnitude. Note that the current reaches this low magnitude at a diode activation voltage 308 (also referred to in the art as a diode forward voltage), which is greater than zero. In particular aspects, the diode activation voltage 308 can be between about 0.3 volts and about 0.8 volts. After reaching $V_{PROGRAM}$ 306, current remains at the low magnitude for voltages between zero and diode activation voltage 308.

Referring now to erase cycle 304, a magnitude of negative voltage can increase from about zero volts to a reverse breakdown voltage 312 (e.g., where the reverse breakdown voltage is selected from between about −1 volts to about −2 volts), while current response of the memory cell remains at very low magnitude. After reaching the reverse breakdown voltage 312, current response increases substantially until an erase voltage 310 is reached. In some aspects, erase voltage 310 can be about −4.5 volts, although the subject disclosure is not limited to these aspects. At the erase voltage 310, current drops off substantially as the conductive filament is deformed in the memory cell. Current remains at very low magnitude as the magnitude of the voltage varies between erase voltage 310 and $V_{PROGRAM}$ 306.

The diode activation voltage 308 and reverse breakdown voltage 312 can help deter sneak path currents in a crossbar memory array. Sneak path currents in a crossbar memory array are generally caused by small voltage differences observed at neighboring metal electrodes. When such voltage differences occur during a memory operation, operational margin for the memory operation can be significantly reduced. For instance, for a read operation, sensing margin that distinguishes a program state from an erase state can be significantly reduced from the presence of sneak path currents, particularly sneak path currents having magnitudes on an order with a read current (e.g., see FIG. 5, infra). However, for voltage differences smaller than reverse breakdown voltage 312 (for negative voltages) or diode activation voltage 308 (for positive voltages), current through the memory cell is greatly mitigated as shown by current-voltage graph 300. This effect can reduce sneak path currents, maintaining operational margin for memory cells in a 1T-xR crossbar memory array, even for substantially large values of 'x'.

Figure 4A:
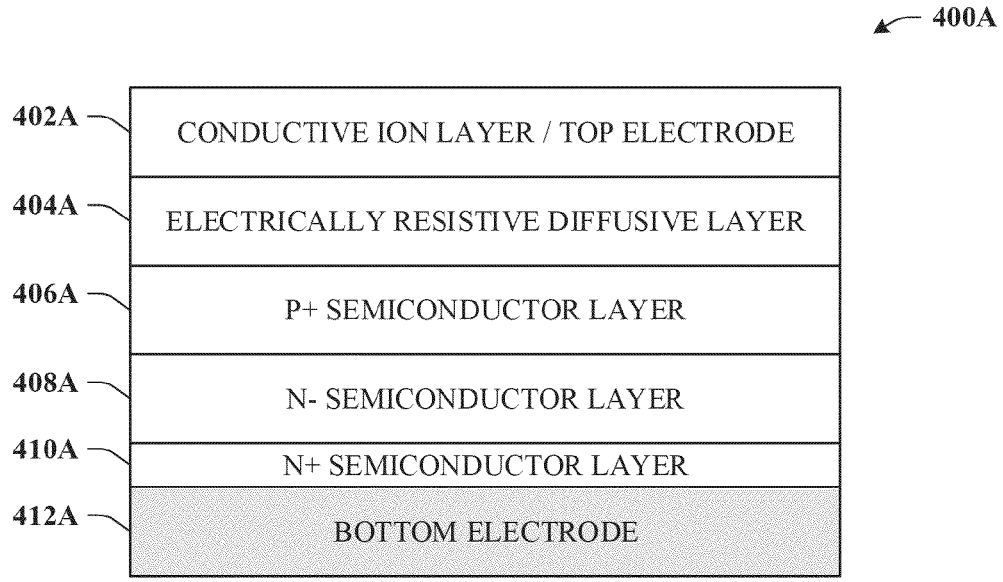
FIGS. 4A and 4B depict block diagrams of example memory cell stacks according to alternative aspects of the subject disclosure.
Figure 4B:
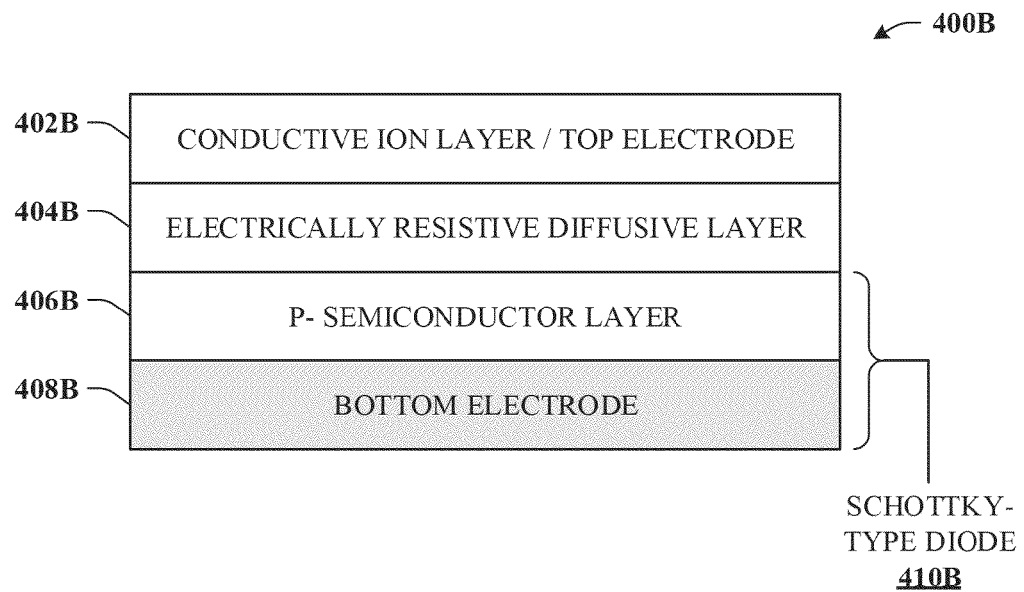

FIGS. 4A and 4B illustrate block diagrams of alternative resistive switching memory cells 400A, 400B, according to one or more additional aspects of the subject disclosure. In addition, resistive switching memory cells 400A, 400B have respective rectifier characteristics. These rectifier characteristics can be determined by composition of the respective memory cells 400A, 400B, or dopant concentration of semiconductor layers, or the like, or suitable combinations thereof.

Referring first to FIG. 4A, a memory cell 400A is depicted. Memory cell 400A can comprise a conductive ion layer 402A. Conductive ion layer 402A can be a top metal electrode (e.g., silver, . . . ) in at least one aspect of the subject disclosure. Adjacent to conductive ion layer 402A is an electrically resistive diffusive layer 404A. Electrically resistive diffusive layer 404A is at least in part permeable to free ions of conductive ion layer 402A. Accordingly, in response to a suitable voltage, free ions within conductive ion layer 402A can enter electrically resistive diffusive layer 404A and form a conductive filament therein (e.g., see FIG. 2, supra). An example of a material suitable for electrically resistive diffusive layer 404A can be amorphous silicon or a derivative of silicon oxide, as was previously discussed. Memory cell 400A can further comprise a p+ type semiconductor layer 406A, with elevated concentration of p type dopant material. Adjacent to p+ type semiconductor layer 406A is an n− semiconductor layer with a reduced concentration of n type dopant material. Adjacent to n− type semiconductor layer is an n+ semiconductor layer with an elevated concentration of n type dopant material. In at least one aspect of the subject disclosure, concentrations of elevated dopant material (p type or n type) can be between about $10^{17}/cm^3$ and about $10^{20}/cm^3$, whereas concentrations of reduced dopant material (p type or n type) can be between about $10^{13}/cm^3$ and about $10^{17}/cm^3$. A bottom electrode 412A is adjacent to, or connected to n+ semiconductor layer 410A. Bottom electrode 412A can be made of tungsten, aluminum, titanium nitride or platinum, in some disclosed aspects, or another suitable conductive element or compound in other aspects.

Referring now to FIG. 4B, a memory cell 400B is depicted. Memory cell 400B can comprise a conductive ion layer 402B. Similar to memory cell 400A, conductive ion layer 402B can serve as a top electrode for memory cell 400B, in some aspects. In other aspects, conductive ion layer 402B can be in addition to the top electrode. Adjacent to conductive ion layer 402B is an electrically resistive diffusive layer 404B. Electrically resistive diffusive layer 404B can include an amorphous silicon or derivative of silicon oxide material, or other suitable material having a very high electrical resistance (e.g., compared to conductive ion layer 402B) as well as permeability to free ions of conductive ion layer 402B. Conductive ion layer 402B and electrically resistive diffusive layer 404B can form a resistive switching component of a memory cell with rectifier characteristics, as described herein. In addition, memory cell 400B can comprise a p– type semiconductor layer 406B adjacent to a metal bottom electrode 408B. The p– type semiconductor layer 406B and metal bottom electrode 408B can form a Schottky-type diode component 410, having rectifier characteristics. Thus, the combination of p– type semiconductor layer 406B and metal bottom electrode 408B can provide the rectifier characteristics for the memory cell, mitigating sneak path currents at memory cell 400B resulting from suitably low voltages applied across memory cell 400B.

Figure 5:
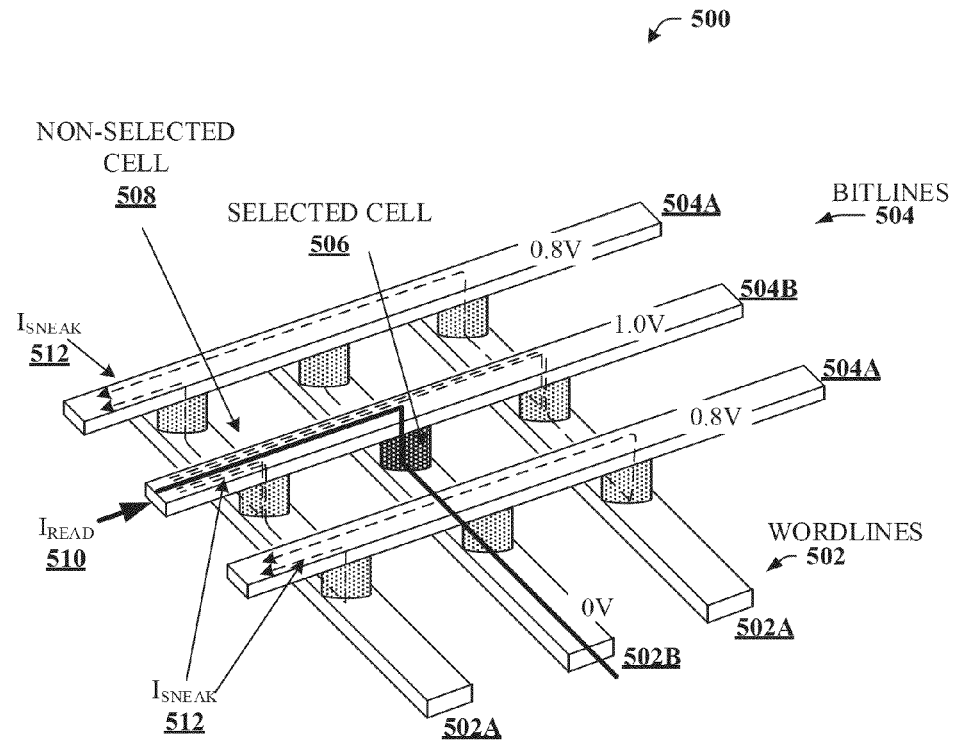
FIG. 5 illustrates a diagram of an example crossbar memory architecture and associated sneak path currents.

Turning now to FIG. 5, system 500 is depicted. System 500 is an example memory array comprising a crossbar architecture of memory cells. System 500 is used to illustrate practical distinctions between memory cells that mitigate sneak path current in a program state versus memory cells that have much higher sneak path current in the program state. Thus two different scenarios are presented. In both cases, system 500 includes various wordlines 502 and bitlines 504 in which a single cell among the array can be selected based upon an applied bias between a particular wordline and a particular bitline, with the selected cell representing the junction of the particular wordline and particular bitline. As a more specific example, bitlines 504 can include a two un-selected bitlines 504A, and a selected bitline 504B. Likewise, wordlines 502 can include two un-selected wordlines 502A and a selected wordline 502B. A selected memory cell 506 (dark shading) of system 500 is located at a junction of selected wordline 502B and selected bitline 504B.

In both example scenarios discussed below, the selected memory cell 506 is in the "off" state (also referred to as the "erase" state) while cell 508 and other neighbors of cell 506 are in the "on" state (also referred to as the "program" state). Further assume that the applied bias (e.g., read voltage) is 1.0 V and this corresponds with an associated read current 510 for a cell in the "on" state of about 1.5 micro amps (µA), but of a significantly lower value if the cell is in the "off" state (e.g., about 150 nanoamps (nA) or less).

It is understood that different bitlines 504 observe small differences in voltage (e.g., resulting from differences in the program pattern in the array). For instance, selected bitline 504B connected to selected memory cell 506 (dark shading) experiences a read voltage of 1.0 volts; whereas un-selected wordlines 504A connected only to un-selected memory cells 508 (all lightly shaded cells) experience about 0.8 volts. This difference of 0.2 volts can result in several sneak path currents 512 throughout memory architecture 500, depicted by the dashed lines.

As described herein, a read operation generally involves measuring or sensing a magnitude of a current flowing through a selected memory cell in response to application of a read voltage to that selected memory cell. A read current, $I_{READ}$ 510 is depicted by a bold line, following a read path through selected bitline 504B, through selected memory cell 506, and out selected wordline 502B. Because of the difference in voltage on the un-selected bitlines 504A and selected bitline 504B, sneak path currents 512 (depicted by the dashed lines) are produced through those of the non-selected memory cells 508 that are located on un-selected wordlines 502A. Sneak path currents along un-selected wordlines 502A and un-selected bitlines 504A can add to (or subtract from, depending on polarity) the magnitude of $I_{READ}$ 510, distorting its value. For instance, if the net effect of the sneak currents is to increase $I_{READ}$ 510 by several tens of nA, then a significant loss of sensing margin for the 150 nA read current for an "off" state selected cell 506 is observed at memory architecture 500. This can negatively impact data integrity and performance of the read operations of memory cells of memory architecture 500. Moreover, if sneak currents net to increase $I_{READ}$ 510 on the order of about 150 nA, then selected memory cell 506, which is in the "off" state and therefore should have a read current 510 several times lower, might actually be sensed as being in the "on" state.

Thus, in a first case, consider the crossbar array of system 500 is populated with memory cells that have little to no sneak path current mitigation. In that case, read current 510 of about 150 nA flows through selected memory cell 506 and sneak path currents 512 are produced through the un-selected cells located on un-selected wordlines 502A. Assuming a substantially linear current-voltage relationship for these cells, the individual magnitudes of these sneak path currents is approximately 30 nA (e.g., if 1.0 V produces 150 nA then, linearly, 0.2 V produces about 30 nA). Hence, even though selected memory cell 506 is in the "off" state, selected bitline 504B can observe a significant current flow, resulting from 150 nA read current, plus 30 nA for each of the sneak path currents flowing through selected bitline 504B. Accordingly, a small number of sneak path currents can significantly reduce sensing margin. For example about five sneak path currents of 30 nA can double the above read current of 150 nA, to 300 nA through the selected bitline 504B. At some point, a sufficient number of sneak path currents can cause the "off" cell to be read as an "on" cell, thereby inducing memory error.

Figure 6:
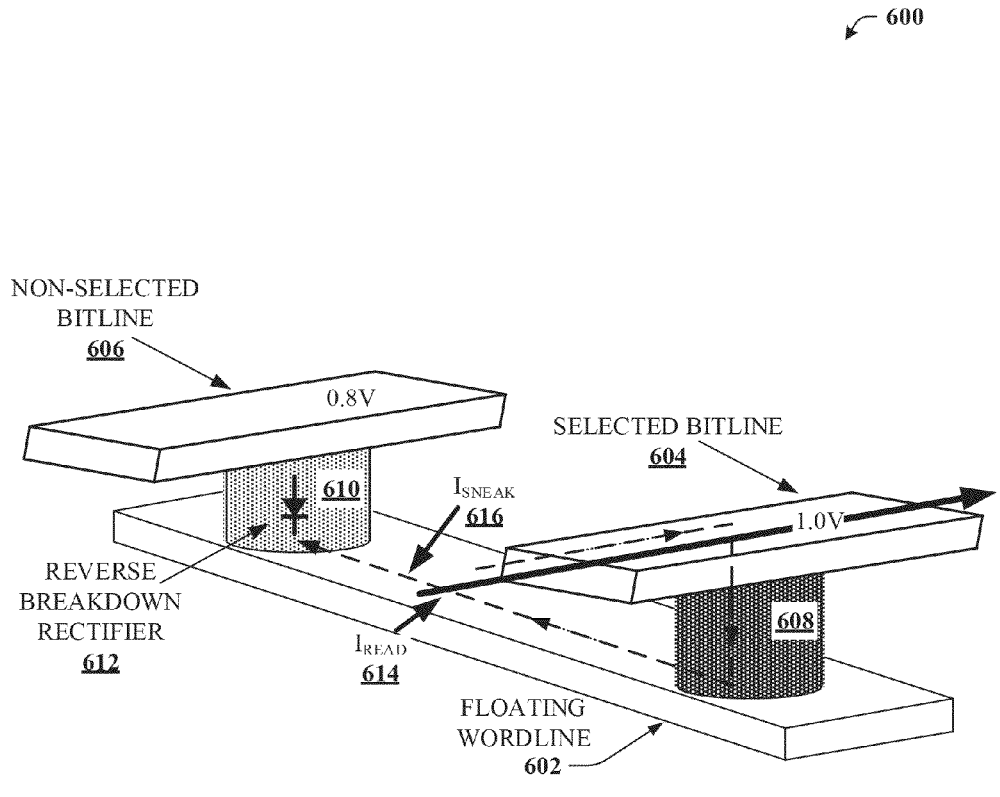
FIG. 6 illustrates a diagram of an example crossbar memory architecture having memory cells with rectifier characteristics, and the affect on sneak path currents.

However, if the current-voltage relationship is rectified at low memory cell voltages, then the magnitudes of these sneak path currents can be significantly reduced. So, in the second case, un-selected wordlines 502A can be floated or driven at 0.8 volts to minimize the voltage across memory cells of these wordlines. Further, consider the crossbar array of system 500 is populated with memory cells according to various embodiments described herein (e.g., solid state memory cell 100, 200, 400A, 400B, or the like), in which the cell exhibits a non-linear relationship between current and voltage near a rectifier voltage. In that case, a voltage differential of 0.2 V, if smaller than the rectifier voltage, that produced a sneak current of 30 nA in the linear case might only produce a sneak current much smaller (e.g., 3 nA, 0.3 nA, . . . ) depending on the rectifier characteristics of the memory cell. Therefore, when compared to the non-rectified memory cells, the rectified memory cells provide a significantly larger margin for on-off state comparison and lower power consumption. FIG. 6, infra, illustrates an example of rectifier characteristics mitigating sneak path currents for neighboring memory cells.

FIG. 6 illustrates a diagram of an example crossbar architecture 600 of solid state memory cells exhibiting sneak path current mitigation, according to additional aspects of the subject disclosure. Crossbar architecture 600 includes a wordline 602, which can be a floating wordline not connected to a voltage source, and a pair of bitlines, driven (selected) bitline 604 and non-selected bitline 606. At a junction of wordline 602 and each of bitlines 604, 606 is a solid state memory cell. Particularly, at the junction of selected bitline 604 and wordline 602 is an erased, or "off-state" memory cell 608, and at the junction of non-selected bitline 606 and wordline 602 is a programmed, or "on-state" memory cell 610. Both erased memory cell 608 and programmed memory cell 610 can be resistive switching memory cells comprising rectifier characteristics, as described herein. For instance, erased memory cell 608 and programmed memory cell 610 can have a current-voltage characteristic similar to that depicted in FIG. 3, in some aspects of the subject disclosure.

Selected bitline 604 has a voltage of 1.0 volts, and wordline 602 is floating. This 1.0 volts is a read voltage that generates a read current $I_{READ}$ 614 through driven bitline 604. $I_{READ}$ 614 can have relatively low magnitude if a memory cell selected for read is in an "off state" (e.g., 150 nA utilizing the illustrative example of FIG. 5), and will pass through the selected memory cell on a grounded wordline (not depicted, but see selected cell 506 positioned on the middle of wordlines 502 of FIG. 5, supra, as an example). Differences in state of erased memory cell 608 and programmed memory cell 610 can cause voltage differences in selected bitline 604 and non-selected bitline 606. Thus, non-selected bitline 606 can experience a voltage other than 1.0 volts, such as 0.8 volts. The 0.2 volt differential between selected bitline 604 and non-selected bitline 606 induces a sneak current $I_{SNEAK}$ 616 that flows from selected bitline 604 to non-selected bitline 606 along wordline 602. In the event that programmed memory cell 610 has no rectifier characteristics, $I_{SNEAK}$ 616 could have a significant current magnitude relative to $I_{READ}$ 614 of erased memory cell 608. Large sneak path currents have the capability to reduce sensing margin and even cause memory errors, as described herein. However, where programmed memory cell 610 has rectifier characteristics, such as a reverse breakdown voltage 612, the magnitude of $I_{SNEAK}$ 616 will remain small, on an order of current magnitude for an erased memory cell or smaller (depending, e.g., on a value of the voltage differential between selected bitline 604 and non-selected bitline 606).

Figure 7:
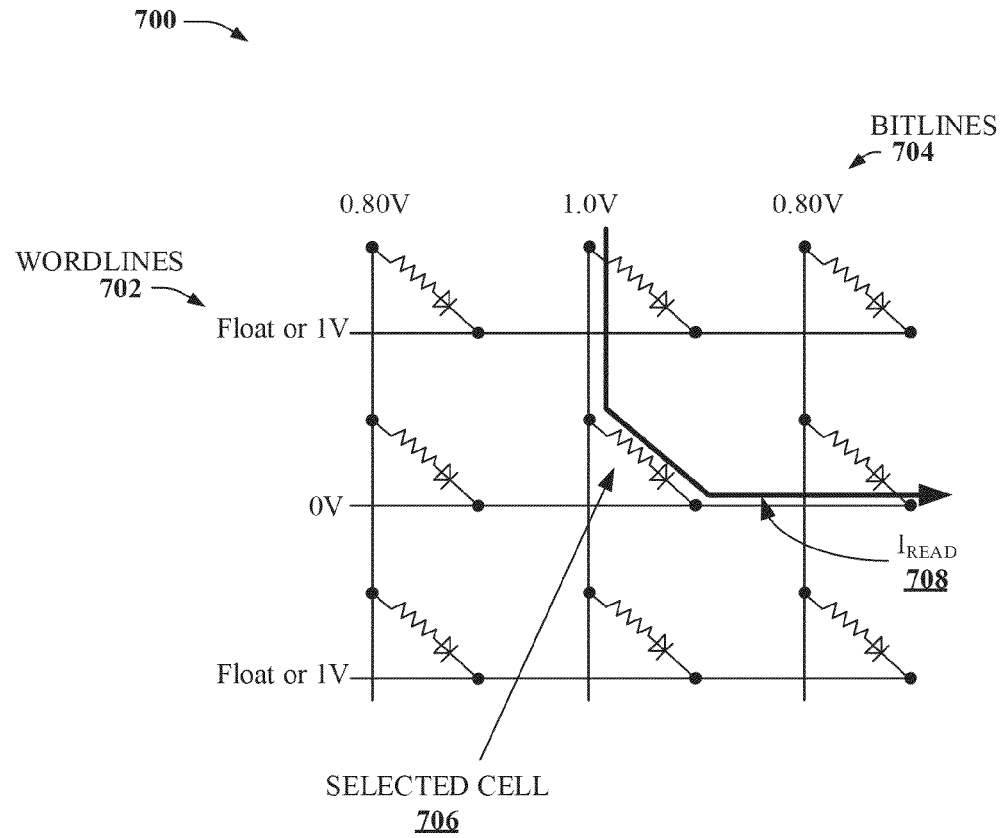
FIG. 7 depicts a circuit diagram of an example crossbar memory architecture having memory cells with rectifier characteristics.

FIG. 7 illustrates a circuit diagram of an example crossbar memory architecture 700 comprising resistive switching rectified memory cells, according to further aspects of the subject disclosure. Crossbar memory architecture 700 comprises a set of wordlines 702 intersecting a set of bitlines 704 at respective intersections thereof. At each of the respective intersections of one of wordlines 702 and one of bitlines 704 is a resistive switching rectified memory cell. The resistive switching rectified memory cells are depicted in circuit form as a resistor in series with a diode. A selected cell 706 is positioned at the center of crossbar memory architecture 700. Selected cell 706 can be programmed or erased, resulting in different respective magnitudes of read current $I_{READ}$ 708. Though sneak path currents can occur at each of the other memory cells, these sneak path currents will be small relative to $I_{READ}$ 708. Moreover, so long as sensing margin is many times higher (e.g., 100 times higher) than sneak path current magnitude, crossbar memory architecture 700 can have a 1T-xR construction with large values for 'x' (e.g., where 'x' can be selected to be between 2 and 99, depending on a desired minimum sensing margin).

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise a read process, or vice versa, to facilitate programming and reading a semiconductor cell by way of a single process. In addition, it should be appreciated that respective rows of disclosed memory architectures can be erased in groups (e.g., multiple rows erased concurrently) or individually. Moreover, it should be appreciated that multiple disclosed memory cells arranged on a particular row can be programmed in groups (e.g., multiple memory cells programmed concurrently) or individually. Components of the disclosed architectures can also interact with one or more other components not specifically described herein but known by those of skill in the art.

Figure 8:
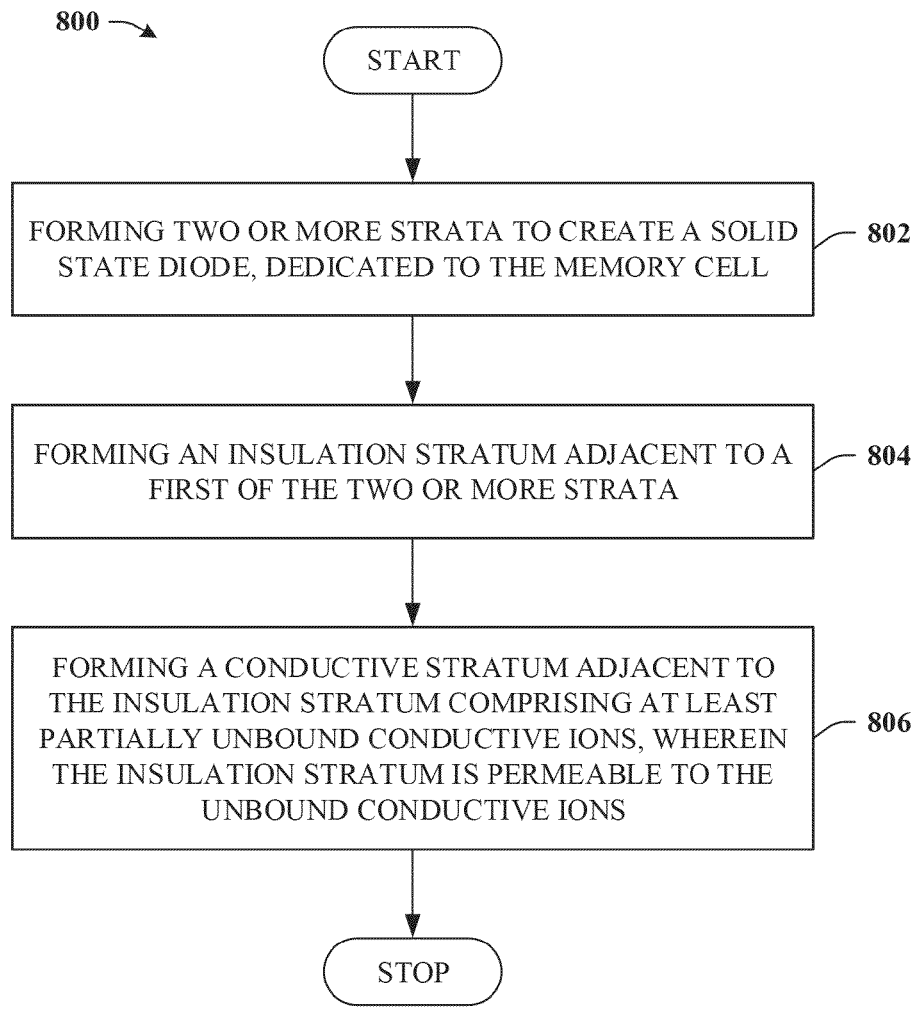
FIG. 8 illustrates a flowchart of a sample method for fabricating a two-terminal memory cell comprising rectifier characteristics according to further aspects.
Figure 9:
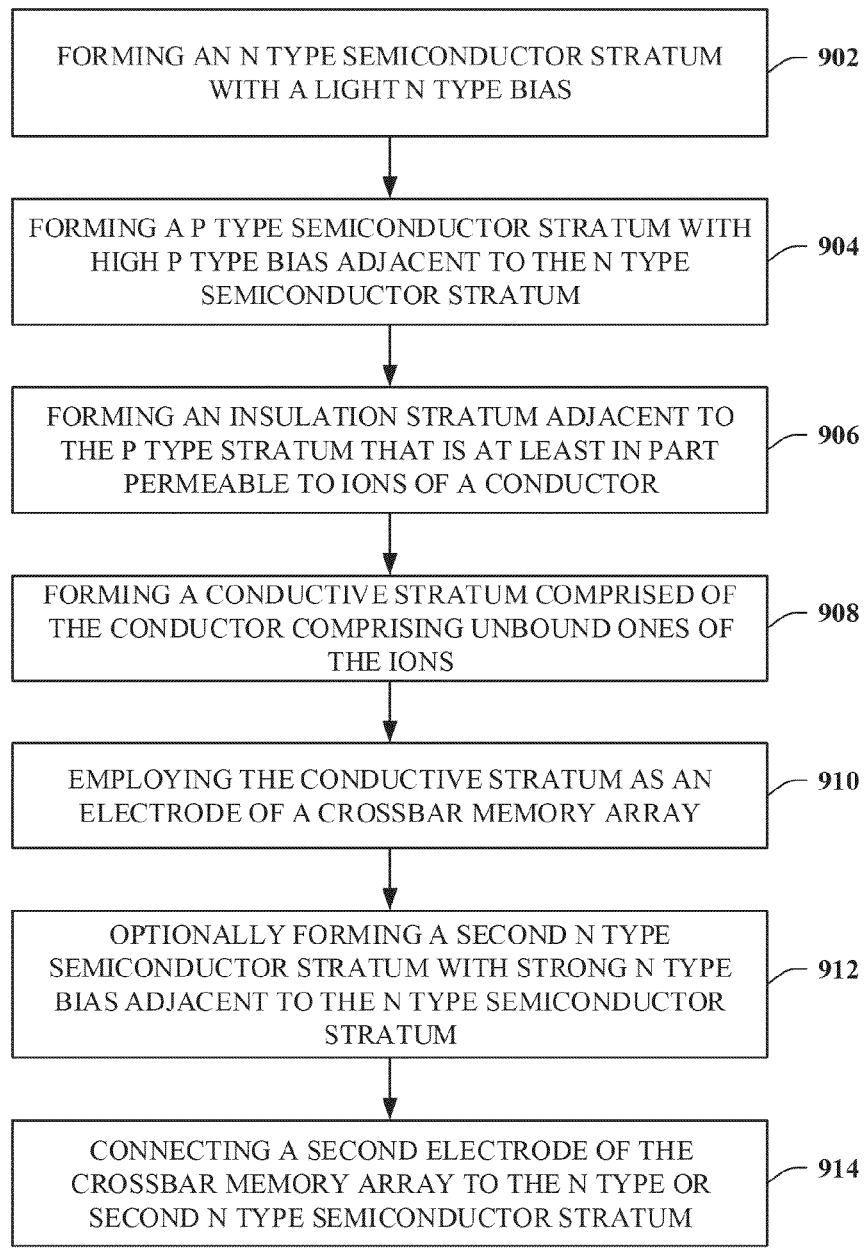
FIG. 9 depicts a flowchart of an example method for fabricating a resistive switching memory cell comprising a solid state diode device.

In view of the exemplary diagrams described supra, process methods that can be implemented in accordance with the disclosed subject matter will be better appreciated with reference to the flow charts of FIGS. 8 and 9. While for purposes of simplicity of explanation, the methods of FIGS. 8 and 9 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 illustrates a flowchart of an example method 800 for fabricating a resistive switching memory cell having rectifier characteristics, according to one or more additional aspects of the subject disclosure. At 802, method 800 can comprise forming two or more strata to create a solid state diode dedicated to the memory cell. The dedicated solid state diode can result from the two or more strata being exclusive to the resistive switching memory cell (e.g., not shared among multiple memory cells). This can be in contrast, for instance, to a relatively large n-well, common to a chip or to many memory cells, which acts as a shared semiconductor layer for a large number of memory cells. The n-well will generally require a reverse bias and very large breakdown voltage, generally much larger than the two or more strata exclusive to the memory cell. In some aspects the two or more strata can comprise a p+ type semiconductor layer and an n− type semiconductor layer. In other aspects, the two or more strata can comprise a p type semiconductor layer and a n+ type semiconductor layer. In one or more alternative or additional aspects, the two or more strata can comprise a p+ semiconductor layer, an n-semiconductor layer and an n+ semiconductor layer. In still other aspects, the two or more strata can comprise a p− semiconductor layer in conjunction with a metal layer, such as a metal electrode (e.g., silver, platinum, . . . ). At 804, method 800 can comprise forming an insulation stratum adjacent to a first of the two or more strata that is permeable to conductive ions of a conductive material. The insulation stratum is electrically resistive. The insulation stratum can be comprised of an RSL, for instance, which could include a-Si, a silicon dioxide or derivatives of silicon oxide, including silicon sub-oxide $SiO_x$, where x<2, silicon germanium, silicon germanium oxide or derivatives thereof, or the like, or suitable combinations of the foregoing. At 806, method 800 can comprise forming a conductive stratum adjacent to the insulation stratum. The conductive stratum can be made of the conductive material and can comprise unbound ones of the conductive ions to which the insulation stratum is permeable. Particularly, the conductive material can comprise a suitable metal, metals, or conductive compound having the unbound conductive ions. Examples can include silver, platinum or other suitable conductors comprising ions.

FIG. 9 illustrates a flowchart of an example method 900 according to still other aspects of the subject disclosure. Method 900 can be implemented to provide, for instance, fabrication of a resistive switching memory cell having rectifier characteristics according to still other aspects of the subject disclosure. At 902, method 900 can comprise forming an n type semiconductor stratum. In a particular aspect, the n type semiconductor stratum can have a light n type bias. At 904, method 900 can comprise forming a p type semiconductor stratum adjacent to the n type semiconductor stratum. In one or more disclosed aspects, the p type semiconductor stratum can have a high p type bias. At 906, method 900 can comprise forming an insulation stratum bias adjacent to the p type semiconductor stratum that is at least in part permeable to ions of a conductive element or compound. At 908, method 900 can comprise forming a conductive stratum made of the conductive element or compound and comprising unbound ones of the ions. At 910, method 900 can comprise employing the conductive stratum as an electrode of a crossbar memory array, or connecting the conductive stratum to such electrode. At 912, method 900 can optionally comprise forming a second n type semiconductor stratum with strong n type bias adjacent to the n type semiconductor stratum. At 914, method 900 can comprise connecting a second electrode of the crossbar memory array to the n type semiconductor layer or optionally the second n type semiconductor stratum if formed at reference number 912.

Figure 10:
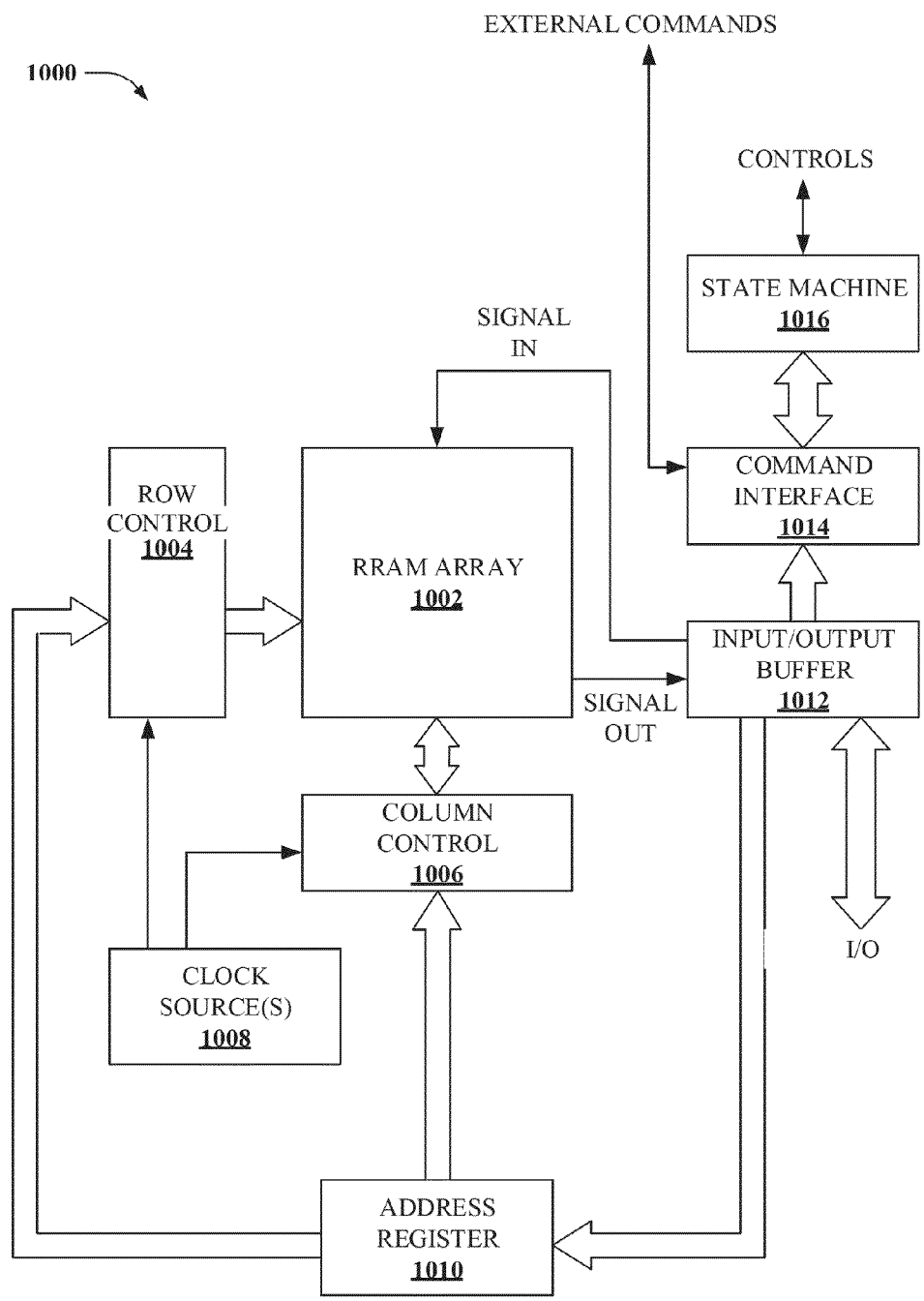
FIG. 10 illustrates a block diagram of an example electronic control environment for an array of memory cells according to further disclosed aspects.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1102 of FIG. 11, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell memory cell technology. Particularly, memory cell array can comprise resistive switching memory cells having rectifier characteristics, as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted, but see e.g., computer 1102 of FIG. 11, infra) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of memory cell array 1002. State machine 1016 receives commands from the host apparatus via input/output interface 1012 and command interface 1014, and manages read, write, erase, data input, data output, and like functionality associated with memory cell array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
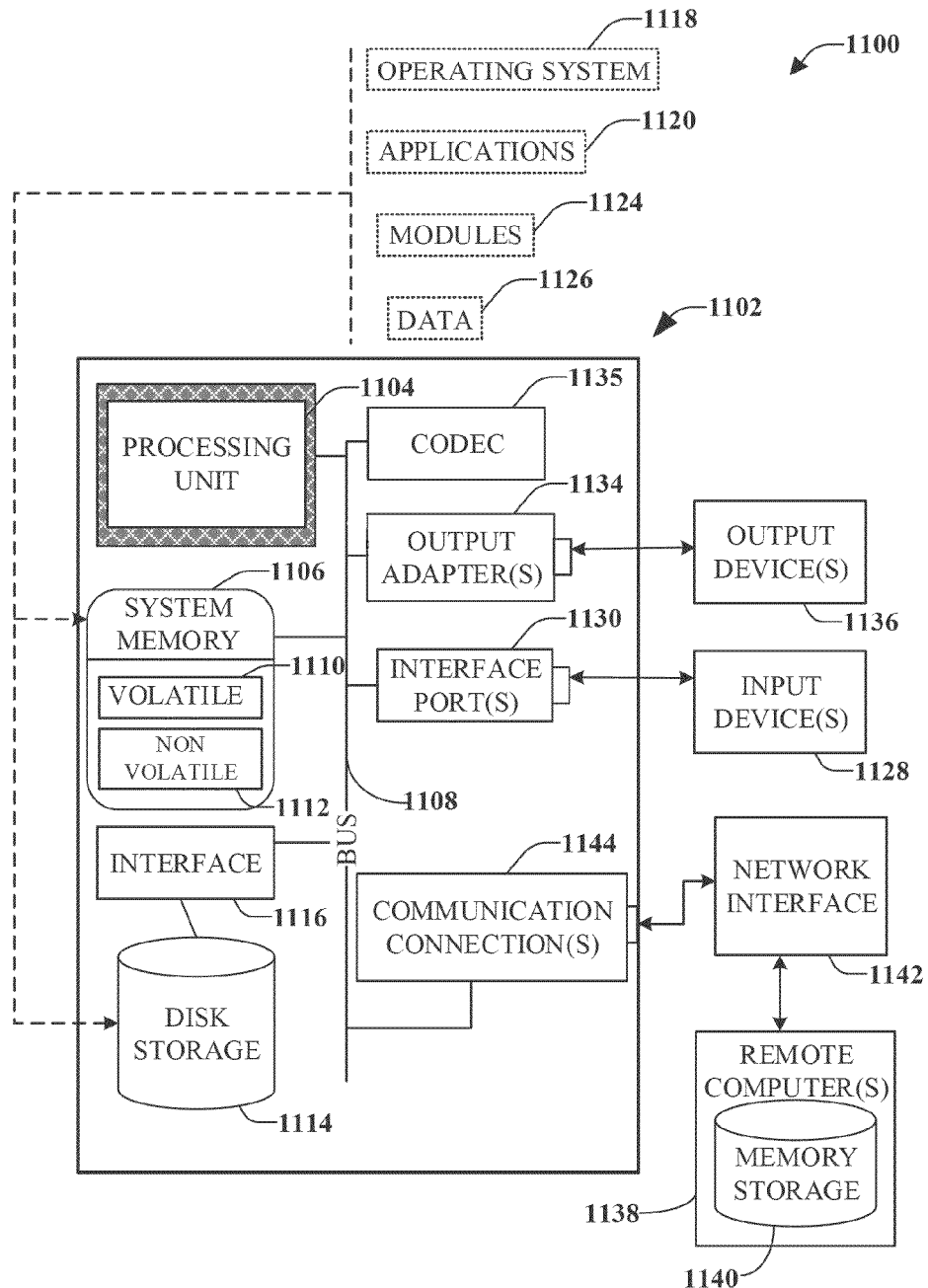
FIG. 11 depicts a block diagram of an example operating environment for facilitating implementation of one or more aspects disclosed herein.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1106 includes volatile memory 1110 and non-volatile memory 1112. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or flash memory. Volatile memory 1110 includes random access memory (RAM), which acts as external cache memory. According to present aspects, the volatile memory may store the write operation retry logic (not shown in FIG. 11) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A solid state memory cell, comprising:
an ion source layer comprising unbound conductive ions;
an insulator layer that is at least in part permeable to the unbound conductive ions of the ion source layer, wherein the ion source layer is directly adjacent to the insulator layer, and the ion source layer and insulator layer form a resistive switching component having a plurality of resistance states in response to respective bias voltages at a pair of conductive electrodes;
a p semiconductor layer; and
an n semiconductor layer adjacent to the p semiconductor layer, wherein the p semiconductor layer and the n semiconductor layer are exclusive to the memory cell and form a solid-state p-n diode in series with the resistive switching component, wherein the p-n diode mitigates sneak path current flow through the solid state memory cell.

2. The solid state memory cell of claim 1, wherein the solid state memory cell is positioned between the pair of conductive electrodes, a first of the pair of electrodes is directly adjacent to the ion source layer and a second of the pair of conductive electrodes adjacent to the n semiconductor layer.

3. The solid state memory cell of claim 2, further comprising an n+ semiconductor layer between the n semiconductor layer and one of the pair of conductive electrodes.

4. The solid state memory cell of claim 1, wherein the solid state p-n diode is adjacent to the insulator layer.

5. The solid state memory cell of claim 1, wherein the ion source layer is comprised of silver, copper, aluminum, tungsten, palladium or platinum ions.

6. The solid state memory cell of claim 1, wherein the insulator layer is comprised of at least one of amorphous silicon, a silicon oxide compound, or a silicon germanium oxide compound.

7. The solid state memory cell of claim 6, wherein the silicon germanium oxide compound comprises at least one of four units of germanium or two units of oxygen.

8. The solid state memory cell of claim 1, wherein at least one of the p semiconductor layer or the n semiconductor layer is formed of a low pressure chemical vapor deposition process.

9. The solid state memory cell of claim 1, wherein at least one of the p semiconductor layer or the n semiconductor layer is formed of a plasma enhanced chemical vapor deposition process.

10. The solid state memory cell of claim 1, wherein at least one of the p semiconductor layer or the n semiconductor layer has a thickness between about 5 nanometers (nm) and about 200 nm.

11. The solid state memory cell of claim 1, wherein at least one of:
the p semiconductor layer is doped to a dopant concentration between about $10^{13}$ ions per centimeter cubed (ions/$cm^3$) and about $10^{20}$ ions/$cm^3$; or
the n semiconductor layer is doped to a dopant concentration between about $10^{13}$ ions/$cm^3$ and about $10^{17}$ ions/$cm^3$.

12. The solid state memory cell of claim 1, wherein at least one of the p semiconductor layer is doped with boron ions or the n semiconductor layer is doped with phosphorous ions.

13. The solid state memory cell of claim 1, having the following current-voltage characteristics:
current through the solid state memory cell increases or decreases non-linearly with voltage in response to application of a positive threshold voltage;
current through the solid state memory cell increases or decreases non-linearly in response to application of a negative breakdown voltage; and
wherein a magnitude of the positive threshold voltage or the negative breakdown voltage are determined from relative dopant concentrations of the p semiconductor layer and the n semiconductor layer.

14. A system, comprising; a plurality of first electrodes positioned in parallel in a first direction; a plurality of second electrodes positioned in parallel in a second direction, wherein the second direction is non-parallel to the first direction; a plurality solid state memory cells, wherein each solid state memory cell comprises: an ion source layer comprising unbound conductive ions; an insulator layer that is at least in part permeable to the unbound conductive ions of the ion source layer, wherein the ion source layer is directly adjacent to the insulator layer, and the ion source layer and insulator layer form a resistive switching component configured to be set amongst a plurality of resistance states; a p semiconductor layer; and an n semiconductor layer adjacent to the p semiconductor layer, wherein the p semiconductor layer and the n semiconductor layer form a solid-state p-n series with the resistive switching component, wherein the p-n diode reduces sneak path current flow through the solid state memory cell; and wherein each solid state memory cell is in contact with a single first electrode of the plurality of first electrodes and a single second electrode of the plurality of second electrodes, and no two solid state memory cells are in contact with both a same first electrode and a same second electrode.

15. The system of claim 14, further comprising a row controller, electrically coupled to the plurality of first electrodes, configured to select a target first electrode by application of a first voltage to the target first electrode.

16. The system of claim 15, further comprising a column controller, electrically coupled to the plurality of second electrodes, configured to select a target second electrode by application of a second voltage to the target second electrode.

17. The system of claim 16, further comprising a state machine configured to select a target solid state memory cell in contact with the target first electrode and the target second electrode by controlling one or more clock sources associated with the row controller and column controller to cause the row controller to select the target first electrode and to cause the column controller to select the target second electrode.

18. The system of claim 17, where the state machine is further configured to control the one or more clock sources to select the target solid state memory cell for a read operation by controlling the one or more clock sources to generate the first voltage and the second voltage to produce an activation voltage bias across the target solid state memory cell associated with the read operation.

19. The system of claim 17, where the state machine is further configured to control the one or more clock sources to select the target solid state memory cell for a write operation by controlling the one or more clock to generate the first voltage and the second voltage to produce a program voltage bias across the target solid state memory cell associated with the write operation.

20. The system of claim 17, where the state machine is further configured to control the one or more clock sources to select the target solid state memory cell for an erase operation by controlling the one or more clock sources to generate the first voltage and the second voltage to produce a reset voltage bias across the particular solid state memory cell associated with the erase operation.

\* \* \* \* \*